United States Patent
Jones et al.

(10) Patent No.: US 9,948,401 B1
(45) Date of Patent: Apr. 17, 2018

(54) INDIVIDUAL DC AND AC CURRENT SHUNTING IN OPTICAL RECEIVERS

(71) Applicant: Finisar Corporation, Sunnyvale, CA (US)

(72) Inventors: Theron Lee Jones, White Heath, IL (US); Richard Dean Davis, Champaign, IL (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 15/285,353

(22) Filed: Oct. 4, 2016

(51) Int. Cl.
*H04B 10/69* (2013.01)

(52) U.S. Cl.
CPC .............................. *H04B 10/6911* (2013.01)

(58) Field of Classification Search
CPC ................................................ H04B 10/6911
See application file for complete search history.

(56) References Cited

U.S. PATENT DOCUMENTS

| | | | |
|---|---|---|---|
| 6,956,439 B1 | 10/2005 | Devnath | |
| 7,239,207 B2* | 7/2007 | Seetharaman | H03F 3/082 330/308 |
| 7,418,213 B2* | 8/2008 | Denoyer | H03F 1/08 250/214 C |
| 8,445,832 B2* | 5/2013 | Takemoto | H03F 1/223 250/214 A |
| 9,035,696 B2* | 5/2015 | Sugimoto | H03F 3/087 330/259 |
| 9,473,090 B2* | 10/2016 | Gorecki | H03G 1/0035 |
| 2003/0219260 A1 | 11/2003 | Chiou et al. | |
| 2004/0119539 A1* | 6/2004 | Seetharaman | H03F 3/087 330/308 |
| 2004/0119540 A1* | 6/2004 | Seetharaman | H03F 3/087 330/308 |
| 2004/0119541 A1* | 6/2004 | Seetharaman | H03F 3/087 330/308 |
| 2005/0040892 A1* | 2/2005 | Seetharaman | H03F 1/08 330/308 |
| 2005/0128006 A1* | 6/2005 | Davies | H03F 1/34 330/308 |

(Continued)

OTHER PUBLICATIONS

International Search Report and Written Opinion dated Jan. 15, 2018 in related PCT Application No. PCT/US2017/055208 (11 pages).

*Primary Examiner* — Shi K Li
*Assistant Examiner* — Mina Shalaby
(74) *Attorney, Agent, or Firm* — Maschoff Brennan

(57) ABSTRACT

A circuit may include amplifier circuitry configured to receive a current signal at an amplifier input node, convert the current signal to a voltage signal, and output the voltage signal at an amplifier output node. The circuit may also include overload circuitry configured to receive a replica DC input voltage and a replica DC output voltage. The overload circuitry may be further configured to detect that the current signal exceeds a threshold level based on the replica DC input voltage and the replica DC output voltage. In addition, the overload circuitry may be configured to, in response to and based on detecting that the current signal exceeds the threshold level, direct DC current of the current signal through a DC shunt path and direct AC current of the current signal through an AC shunt path. The AC shunt path may be different from the DC shunt path.

21 Claims, 4 Drawing Sheets

(56) References Cited

U.S. PATENT DOCUMENTS

| | | | |
|---|---|---|---|
| 2005/0195038 A1* | 9/2005 | Neenan | H03F 1/08 330/308 |
| 2006/0290432 A1* | 12/2006 | Chang | H03F 3/45973 330/308 |
| 2008/0007343 A1* | 1/2008 | Natzke | H03F 1/08 330/308 |
| 2008/0007344 A1* | 1/2008 | Natzke | H03F 3/08 330/308 |
| 2004/7111280 | 4/2014 | Schuppener | |

\* cited by examiner

INDIVIDUAL DC AND AC CURRENT SHUNTING IN OPTICAL RECEIVERS

FIELD

The embodiments discussed in the present disclosure are related to individual DC and AC current shunting in optical receivers.

BACKGROUND

Fiber optic receivers used in higher order modulation schemes (e.g., pulse-amplitude modulation) may require a linear processing of the received signal through stages prior to detection. In many systems the gain used for low input signal operation in the presence of noise (e.g. to obtain a target sensitivity) may lead to unacceptable signal distortion at high input signal strength.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit may include amplifier circuitry configured to receive a current signal at an amplifier input node, convert the current signal to a voltage signal, and output the voltage signal at an amplifier output node. The circuit may also include overload circuitry coupled to the amplifier input node and configured to receive a replica DC input voltage at a first overload node. The replica DC input voltage may correspond to a DC input voltage at the amplifier input node. The overload circuitry may also be configured to receive a replica DC output voltage at a second overload node. The replica DC output voltage may correspond to a DC output voltage at the amplifier output node. The overload circuitry may be further configured to detect that a DC component of the current signal exceeds a first threshold level based on the replica DC input voltage and the replica DC output voltage. In addition, the overload circuitry may be configured to direct DC current of the current signal through a DC shunt path in response to and based on detecting that the DC component of the current signal exceeds a first threshold level. Moreover, the overload circuitry may be configured to direct AC current of the current signal through an AC shunt path in response to and based on detecting that shunted DC current passing through the DC shunt path exceeds a second threshold level. The AC shunt path may be different from the DC shunt path.

The object and advantages of the embodiments will be realized and achieved at least by the elements, features, and combinations particularly pointed out in the claims. It is to be understood that both the foregoing general description and the following detailed description are given as examples and are explanatory and are not restrictive of the present disclosure, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Figure 1:
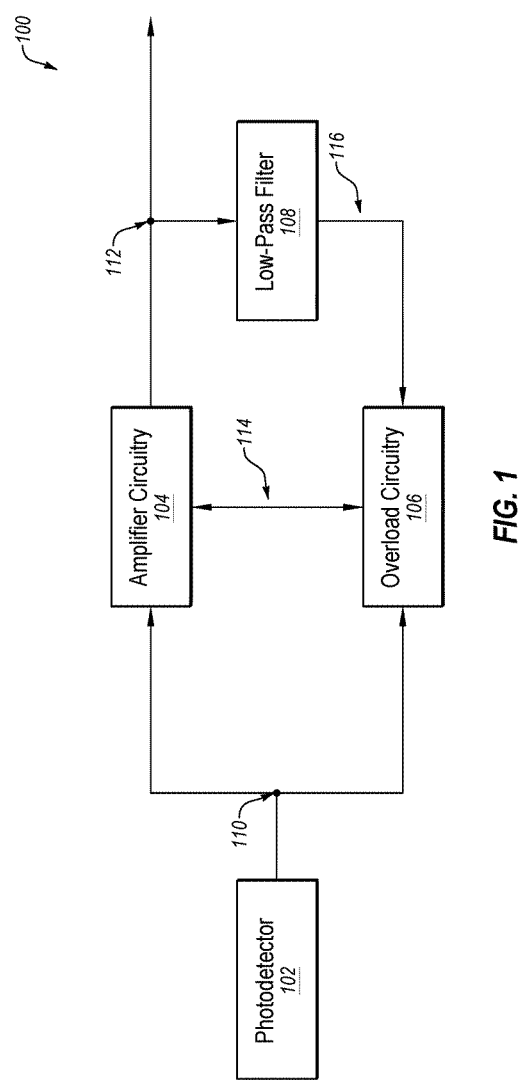
FIG. 1 illustrates an example system that may be included in an optical receiver and that may be configured to shunt DC and AC current components of a current signal.

To avoid distortion at high input current signal levels without altering the functional or parametric operation of the receiver it may be advantageous to remove a portion of the input current signal in a low distortion manner. Further, in many instances, it may be advantageous to remove (or "shunt off") the direct current (DC) portion of the input current signal independently from the alternating current (AC) portion of the input signal.

For example, for optical receivers, an optical input signal is incident upon a photodetector that generates a current that flows unidirectionally into a receiver circuit. This received current signal generally includes a DC component and an AC component. Because the input current signal can only flow in one direction into the optical receiver, a DC component of the input current may be required that supports the peak-to-peak magnitude of the AC component deviation. In order to process only the AC signal component in the optical receiver, it may be desirable to remove the DC component of the input current. In addition, for large AC signal magnitudes, it may be advantageous to reduce the magnitude of the AC component of the input current at large AC input levels by "shunting off" a fraction of the AC component of the input current signal. Furthermore, in some embodiments, the AC shunting may be accomplished in linear manner so as to maintain signal integrity. In some embodiments, the result of the AC shunting should be equivalent to scaling the AC component by a constant of value <1.

According to one or more embodiments of the present disclosure, an optical receiver may include amplifier circuitry and overload circuitry that may be coupled together and configured to remove both DC and AC input current components from a current signal generated by a photodetector that is configured to receive optical signals and convert the optical signals to current signals. As disclosed below, the overload circuitry may be configured to direct shunted DC current via a DC shunt path and may be configured to direct shunted AC current via an AC shunt path that is separate from the DC shunt path. In some embodiments, the overload circuitry may be configured to detect that the current signal exceeds certain threshold levels and may be configured to shunt the DC current and the AC current in response to and based on detecting that the current signal exceeds the threshold levels.

In some embodiments, the overload circuitry may be configured to detect that the current signal exceeds the threshold level by detecting that a DC component of the current signal exceeds a first threshold level. In these or other embodiments, the overload circuitry may be configured to shunt the DC component of the current signal in response to detecting that the DC component of the current signal exceeds the first threshold value. Additionally or alternatively, the overload circuit may be configured to detect that the shunted DC current exceeds a second threshold level in some embodiments. In these or other embodiments, the overload circuit may be configured to shunt the AC component of the current signal in response to and based on detecting that the shunted DC current exceeds the second threshold level. It is noted that in this particular embodiment, the AC component may be shunted based on detecting that the DC component of the current signal exceeds the first threshold in an indirect manner in that the shunted DC component compared against the second threshold is based on detecting that the DC component of the current signal exceeds the first threshold.

In the present disclosure, reference to DC current of a current signal may refer to at least a portion of the DC current component of the current signal. Similarly, reference to AC current of the current signal may refer to at least a portion of AC current component of the current signal.

In the present disclosure various types of transistors are described. For example, bipolar junction transistors ("BJT") and metal-oxide-semiconductor transistors ("MOSFET") are described and the corresponding description uses the nomenclature "base," "collector," and "emitter" or "gate," "drain," and "source" to represent different terminals of the transistors. However, the use of these terms may be used to generically describe analogous terminals of other transistor types. For example, the terms "base" and "gate" may generically describe analogous control terminals that may be used to control operation of transistors.

Embodiments of the present disclosure will be explained with reference to the accompanying drawings.

FIG. 1 illustrates an example system 100 that may be included in an optical receiver and that may be configured to shunt DC and AC current components of a current signal via a DC current path and an AC current path that is separate from the DC current path. The system 100 may generally be part of or form an optical receiver and may include a photodetector 102, trans-impedance amplifier circuitry 104 ("amplifier circuitry 104"), overload circuitry 106, and a low-pass filter 108 ("filter 108").

The photodetector 102 may include any suitable system, apparatus, or device configured to receive an optical signal and configured to convert the optical signal into an electrical signal (e.g., the photodetector 102 may include a photodiode in some embodiments). In particular, in some embodiments, the photodetector 102 may be configured to convert the optical signal into a current signal. The photodetector 102 may be coupled to an amplifier input node 110 such that the photodetector 102 may output the current signal at the amplifier input node 110.

The amplifier circuitry 104 may be coupled to the amplifier input node 110 such that the amplifier circuitry 104 may receive the current signal that may be output by the photodetector 102. The amplifier circuitry 104 may be configured to convert the current signal received at the amplifier input node 110 to a voltage signal. The amplifier circuitry 104 may also be configured to output the voltage signal at an amplifier output node 112.

In some embodiments, the amplifier circuitry 104 may include replica bias circuitry configured to generate a replica DC input voltage based on a replica current. In these or other embodiments, the replica bias circuitry may be configured to output the replica DC input voltage at a first overload node 114.

Additionally or alternatively, the amplifier circuitry 104 may include core amplifier circuitry coupled to the replica bias circuitry and configured to set the DC input voltage at the amplifier input node 110 based on the replica current. In these or other embodiments, the replica bias circuitry and the core amplifier circuitry may include components configured and constructed with respect to each other such that the replica DC input voltage at the first overload node 114 may correspond to the DC input voltage at the amplifier input node 110. For example, in some embodiments, the replica bias circuitry and the core amplifier circuitry may include components configured and constructed with respect to each other such that the replica DC input voltage at the first overload node 114 and the DC input voltage at the amplifier input node 110 may be substantially equal to each other.

Figure 2A:
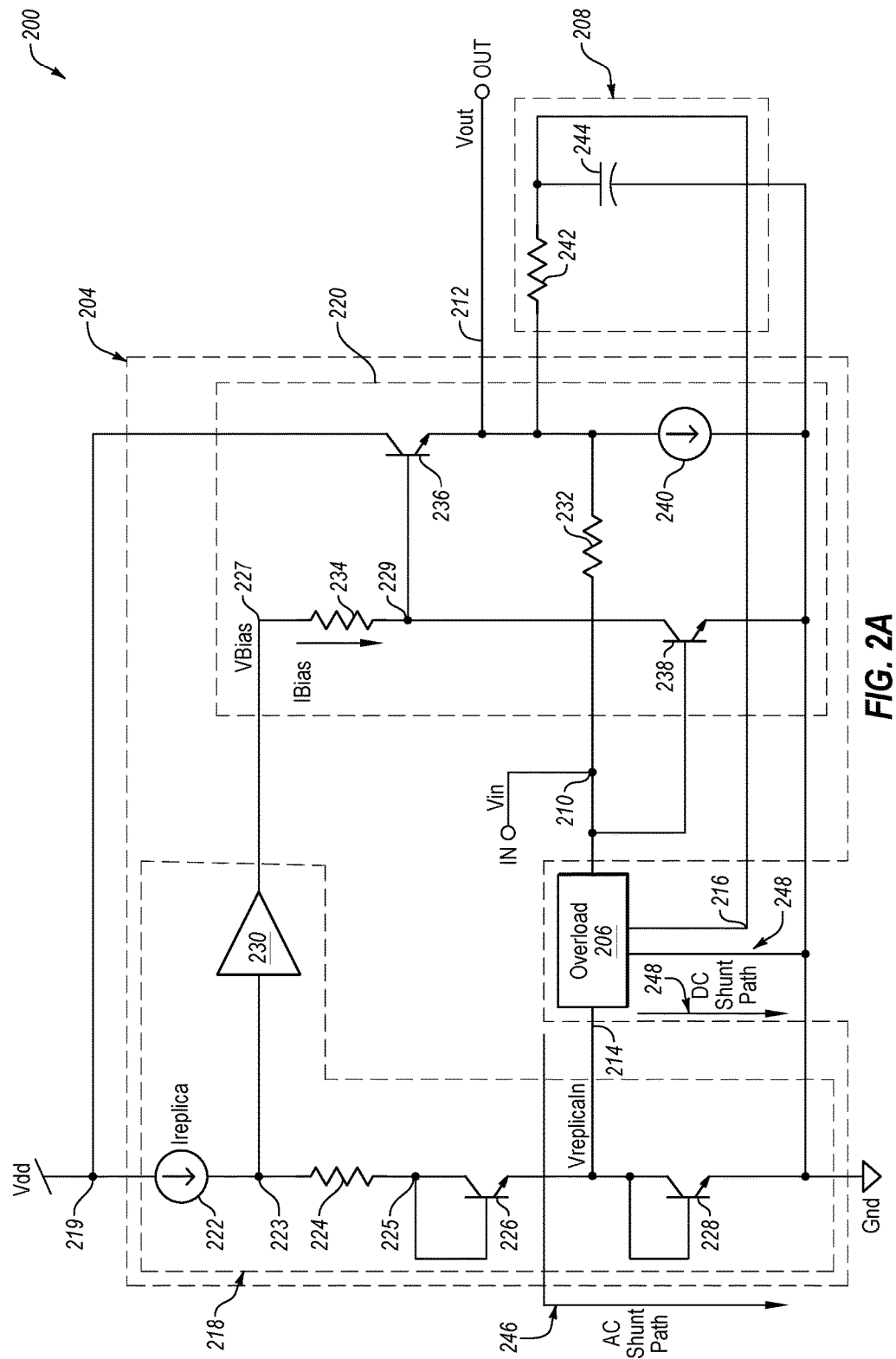
FIG. 2A illustrates a system that may be an example implementation of the system of FIG. 1.

The amplifier circuitry 104 may include any suitable system, apparatus, or device configured and arranged to perform the above-listed operations of the amplifier circuitry 104. FIG. 2A, described below, includes an example configuration of at least a portion of the amplifier circuitry 104.

The low-pass filter 108 may be coupled to the amplifier output node 112 such that the low-pass filter 108 may be configured to receive the voltage signal that may be output by the amplifier circuitry 104. The low-pass filter 108 may be configured to filter higher frequency components of the voltage signal that may be received at the amplifier output node 112 to generate a filtered voltage signal. In some embodiments, the low-pass filter 108 may be configured to filter out AC components of the voltage signal such that the filtered voltage signal may include the DC components of the voltage signal. The low-pass filter 108 may be configured to output the filtered voltage signal at a second overload node 116 in some embodiments. In some embodiments, the filtered voltage signal that may be output at the second overload node 116 may be referred to as a replica DC output voltage in that it may correspond to an average DC voltage of the voltage signal at the amplifier output node 112.

The low-pass filter 108 may include any suitable system, apparatus, or device, configured to perform low-pass filtering of the voltage signal. For example, in some embodiments, the low-pass filter 108 may include a resistor/capacitor ("RC") filter. FIG. 2A, described below, includes an example configuration of the low-pass filter 108.

The overload circuitry 106 may be coupled to the amplifier input node 110, the first overload node 114 and the second overload node 116. The overload circuitry 106 may be configured to receive the replica DC input voltage at the first overload node 114 and may be configured to receive the replica DC output voltage at the second overload node 116. Based on the replica DC input voltage and the replica DC output voltage, the overload circuitry 106 may be configured to detect when the current signal at the amplifier input node 110 exceeds a threshold level. In response to and based on detecting that the current signal exceeds the threshold level, the overload circuitry 106 may be configured to direct at least a portion of the DC current of the current signal through a DC shunt path that may be configured to shunt DC current. Additionally, in response to and based on detecting that the current signal exceeds the threshold level, the overload circuitry 106 may be configured to direct at least a portion of the AC current of the current signal through an AC shunt path that may be configured to shunt AC current. The AC shunt path and the DC shunt path may be separate paths from each other such that the shunted DC current and the shunted AC current may follow different paths.

In some embodiments, as mentioned above, the overload circuitry 106 may be configured to detect that the current signal exceeds the threshold level by detecting that a DC component of the current signal exceeds a first threshold level and may be configured to shunt the DC current in response to detecting that the current signal exceeds the first threshold level. In these or other embodiments, the overload circuit 106 may be configured to shunt the AC current of the current signal in response to and based on detecting that the shunted DC current exceeds a second threshold level.

Figure 2B:
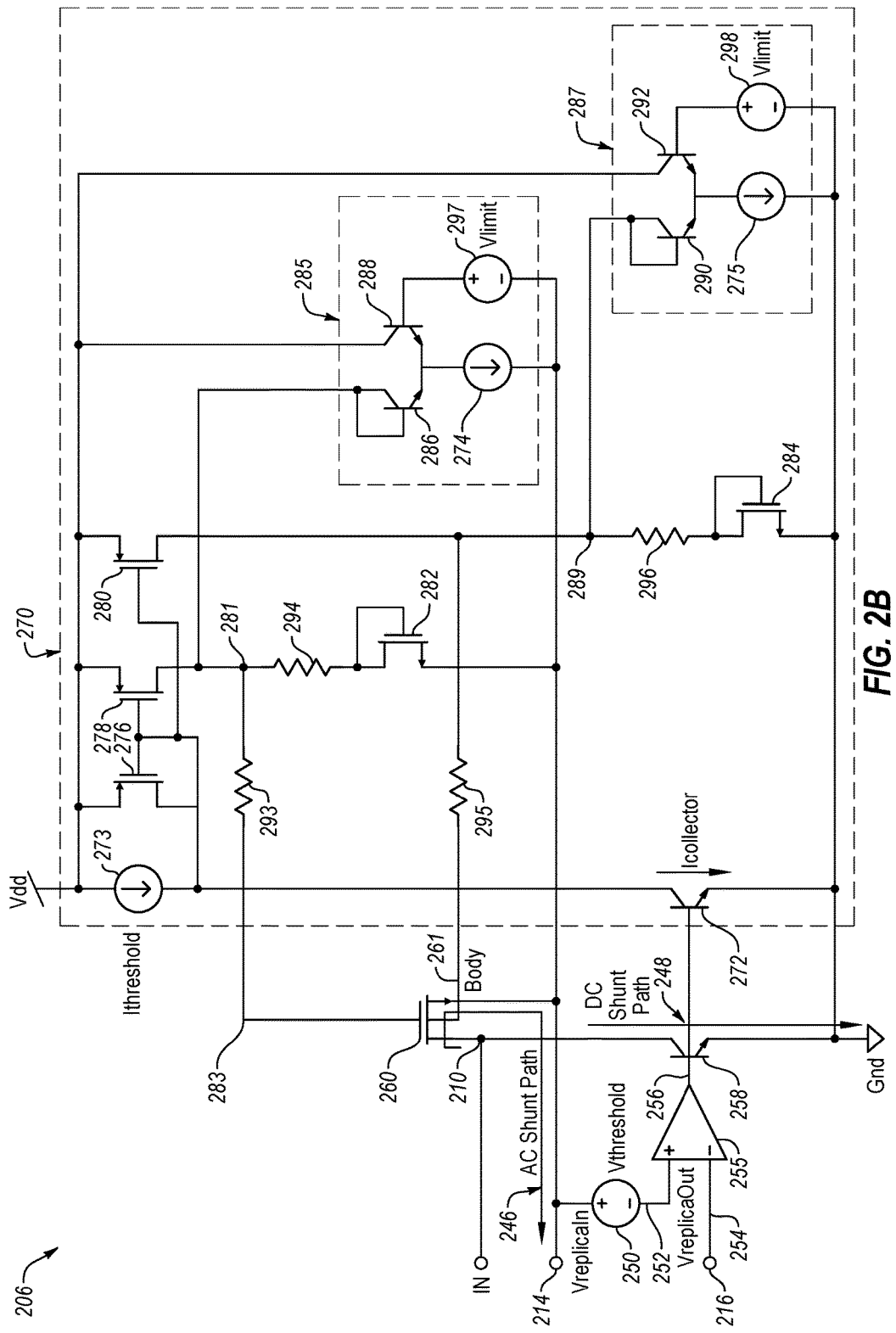
FIG. 2B illustrates an example circuit level diagram of the overload circuitry of FIG. 2A.

The overload circuitry 106 may include any suitable system, apparatus, or device configured and arranged to perform the above-described operations of the overload circuitry 106. FIG. 2B includes an example configuration of the overload circuitry 106.

As described above, the system 100 may accordingly be configured to shunt DC and AC current of a current signal via a DC current path and an AC current path that is separate from the DC current path. Modifications, additions, or omissions may be made to the system 100 without departing from the scope of the present disclosure. For example, the system 100 may include different components than those listed. Further, the labeling of particular elements of the system 100 is to facilitate the description and is not meant to be limiting. For example, in some instances, one or more of the amplifier circuitry 104, the overload circuitry 106, and the low-pass filter 108 may be considered as being included in a single trans-impedance amplifier. Further, other electrical connections and components may be included to effectuate the shunting described. Additionally, use of the terms "coupling" or "coupled" with respect to components may indicate a direct electrical connection between two components in which there may not be any other components between the two components. Further, use of the terms "coupling" or "coupled" with respect to components may indicate an indirect electrical connection between two components in which there may be one or more other components between the two components.

FIG. 2A illustrates a system 200 that may be an example implementation of the system 100 of FIG. 1, according to at least one embodiment of the present disclosure. The system 200 may include amplifier circuitry 204, overload circuitry 206, and a low-pass filter 208. FIG. 2A illustrates an example circuit level diagram of the amplifier circuitry 204 and the low-pass filter 208 as well as a block representation of the overload circuitry 206. FIG. 2B illustrates an example circuit level diagram of the overload circuitry 206 of FIG. 2A.

The system 200 may include an amplifier input node 210, which may be analogous to the amplifier input node 110 of FIG. 1. For example, the amplifier input node 210 may be coupled to a photodetector (e.g. the photodetector 102 of FIG. 1) configured to convert optical signals into current signals. The amplifier input node 210 may be coupled to the photodetector such that the current signals generated by the photodetector are received at the amplifier input node 210. Further, the overload circuitry 206 and core amplifier circuitry 220 of the amplifier circuitry 204 may each be coupled to the amplifier input node 210 in the manner illustrated. The operations of the overload circuitry 206 and the core amplifier circuitry 220 with respect to the amplifier input node 210 are described in further detail below.

The system 200 may also include a first overload node 214, which may be analogous to the first overload node 114 of FIG. 1. The first overload node 214 may be coupled to the overload circuitry 206 and may be coupled to replica bias circuitry 218 of the amplifier circuitry 204 in the manner illustrated. The operations of the overload circuitry 206 and the replica bias circuitry 218 with respect to the first overload node 214 are described in further detail below.

The system 200 may also include a second overload node 216, which may be analogous to the second overload node 116 of FIG. 1. The second overload node 216 may be coupled to the overload circuitry 206 and may be coupled to an output of the low-pass filter at in the manner illustrated. The operations of the overload circuitry 206 and the low-pass filter 208 with respect to the second overload node 216 are described in further detail below.

In addition, the system 200 may include an amplifier output node 212, which may be analogous to the amplifier output node 112 of FIG. 1. The amplifier output node 212 may be coupled to the core amplifier circuitry 220 and may be coupled to an input of the low-pass filter 208 in the manner illustrated. The operations of the core amplifier circuitry 220 and the low-pass filter 208 with respect to amplifier output node 212 are described in further detail below.

As indicated above, the amplifier circuitry 204 may include replica bias circuitry 218. In some embodiments, the replica bias circuitry 218 may be configured such that a replica DC input voltage at the first overload node 214 ("VreplicaIn") corresponds to a DC voltage at the amplifier input node 210 ("Vin"). For example, in some embodiments, the replica bias circuitry 218 may be configured such that VreplicaIn is approximately equal to Vin (outside of random mismatch). In some embodiments, the values of VreplicaIn and Vin may be based on bias voltages (e.g., base to emitter voltages, gate to source voltages, etc.) of transistors that may be included in the system 200).

In particular, the replica bias circuitry 218 may include a current source 222 coupled to a supply node 219 (with a supply voltage Vdd) and configured to generate a replica current ("Ireplica"). The value of Ireplica may be selected based on the sizes, types, bandwidth, etc. of transistors that may be included in the system 200 and a target amount of gain to obtain a target impedance value for a target amount of performance of the system 200. The current source 222 may include any suitable system, apparatus, or device configured to generate Ireplica.

The replica bias circuitry 218 may also include a resistive element 224 coupled to the current source 222 such that Ireplica may pass through the resistive element 224. The resistive element 224 may include any suitable system, apparatus, or device (e.g., one or more resistors, one or more transistors, etc.) configured to provide an electrical resistance. In addition, the replica bias circuitry 218 may include an npn BJT ("BJT") 226. The collector of the BJT 226 and the base of the BJT 226 may be coupled to a node 225 that may also be coupled to the resistive element 224 such as illustrated in FIG. 2A. This particular configuration of the BJT 226 may be such that the BJT 226 may operate as a diode. Further, the emitter of the BJT 226 may be coupled to the first overload node 214 such that Ireplica may pass from the collector to the emitter of the BJT 226.

The replica bias circuitry 218 may also include an npn BJT 228 ("BJT 228") with a base and a collector coupled to the first overload node 214. The emitter of the BJT 228 may be coupled to ground (Gnd). The BJT 228 may accordingly be configured as a diode and may be configured to pass Ireplica to ground. Ireplica passing through the BJT 228 may generate a voltage VreplicaIn that is equal to or approximately equal to the base-emitter voltage (Vbe) of BJT 228. As discussed in further detail below, the overload circuitry 206 may be configured to direct shunted AC current to the first overload node 214 such that the shunted AC current may pass to ground through the BJT 228. As such, in the illustrated embodiment, an AC shunt path 246 of the system 200 may include the overload node 214 and the BJT 228.

The replica biasing circuitry 218 may include a voltage buffer 230 that may have an input coupled to the node 223. The voltage buffer 230 may include an output that may be coupled to a node 227. The voltage buffer 230 may include any suitable system, apparatus, or device configured to generate an output voltage at the node 227 ("VBias") based on a voltage at the node 223. For example, in the illustrated embodiment, the voltage buffer 230 may be configured to generate VBias at node 227 such that it is approximately equal to, or equal to, the voltage at the node 223.

As illustrated in FIG. 2A, the core amplifier circuitry 220 may include two stages in some embodiments. A first stage may include a voltage gain stage that includes a resistive element 234 and an npn BJT 238 ("BJT 238"). A second stage may include a voltage follower stage that includes an npn BJT 236 ("BJT 236"), a current source 240, and a feedback resistive element 232 ("resistive element 232").

The resistive element 232 may be coupled between the amplifier input node 210 and the amplifier output node 212. The resistive element 232 may include any suitable system, apparatus, or device (e.g., one or more resistors, one or more transistors, etc.) configured to provide an electrical resistance. The resistive element 232 may cause a voltage drop to occur between the amplifier input node 210 and the amplifier output node 212. Additionally, an amount of the voltage drop may be based on how much current passes through the resistive element 232, which may be based on the current signal received at the amplifier input node 210 from the photodetector. The output voltage at the amplifier output node 212 ("Vout") may accordingly vary based on the current signal such that Vout may be generated as a voltage signal from the current signal. The amount of resistance of the resistive element 232 may be based on a target amount of gain of the amplifier circuitry 204 while also maintaining a target amount of bandwidth of the amplifier circuitry 204.

In some embodiments, the resistive element 234 may be coupled between the node 227 and a node 229 in the manner illustrated in FIG. 2A. The resistive element 234 may include any suitable system, apparatus, or device (e.g., one or more resistors, one or more transistors, etc.) configured to provide an electrical resistance. In some embodiments, the resistive element 234 and the resistive element 224 may be configured to have the same, or substantially the same, resistance and, as mentioned earlier, VBias may be the same as, or substantially the same as, the voltage the node 223.

In some embodiments, the base of the BJT 236 may be coupled to the node 229, the collector of the BJT 236 may be coupled to the supply node 219, and the emitter of the BJT 236 may be coupled to the amplifier output node 212 in the manner illustrated in FIG. 2A. In addition, in some embodiments, the base of the BJT 238 may be coupled to the amplifier input node 210, the collector of the BJT 238 may be coupled to the node 229, and the emitter of the BJT 238 may be coupled to ground in the manner illustrated in FIG. 2A. Furthermore, the current source 240 may be coupled between the amplifier output node 212 and ground in the manner illustrated.

In normal operation, the core amplifier circuitry 220 may pull the input current flowing into node 210 from the photodiode through the resistive element 232. Because the overload circuit 206 may substantially shunt (remove) the DC component of the input current, the DC voltage drop across the resistive element 232 may be small or approximately zero.

The DC voltage at node 229 may be the sum of three voltages: the voltage at node 210 (Vbe of BJT 238), the DC voltage across resistive element 232, and the voltage between nodes 229 and 212 (Vbe of BJT 236). The voltage at node 210 may be determined by the Vbe control voltage of BJT 238 required to pass a current "Ibias" through BJT 238 from collector to emitter. Further, the voltage between nodes 229 and 212 may be determined by the Vbe control voltage of BJT 236 that may be required to pass the current from current source 240 through BJT 236 from collector to emitter.

In some embodiments, the core amplifier circuitry 220 may be configured such that a ratio between IBias and IReplica is at a target amount. In some embodiments, that ratio may be a one-to-one ratio, and in other embodiments, that ratio may be such that IBias and IReplica are multiples of each other.

For example, for a given target ratio between Ibias and IReplica, the device parameters (e.g. emitter area) of BJT 236 and the BJT 226 may be chosen and configured such that the Vbe of BJT 236 is substantially equal to the Vbe of BJT 226. In these or other embodiments, the BJT 238 and the BJT 228 may be sized and configured such that the Vbe of BJT 238 is substantially equal to the Vbe of BJT 228. It follows, therefore, that the voltage at node 229 may be substantially the same as the voltage at node 225. Both node 229 and node 225 may be two Vbe's above ground in some embodiments. Recall also that the DC voltage Vbias at node 227 may be substantially equal to the voltage at node 223 due to the voltage buffer 230 described earlier. Because the DC voltage across the resistive element 234 may be substantially equal to the DC voltage across resistive element 224, the ratio of currents (IBias/Ireplica) may be equal to or approximately equal to the ratio of (resistance 224/resistance 234).

The core amplifier circuitry 220 may also include other components not illustrated to obtain a target value for IBias in some embodiments. For example, in some embodiments, the core amplifier circuitry 220 may include one or more current sources configured to contribute to the value of IBias such that IBias is at the target value and/or may include a cascode device between the collector of BJT 238 and resistive element 234.

The low-pass filter 208 of the illustrated embodiment may be analogous to the low-pass filter 108 of FIG. 1 in that the low-pass filter 208 may be configured to filter higher frequency components of Vout to generate a filtered voltage signal. In some embodiments, the low-pass filter 208 may be configured to filter out AC components of Vout such that the filtered voltage signal may include the DC components of the voltage signal. The low-pass filter 208 may be configured to output the filtered voltage signal at the second overload node 216 as a replica DC output voltage "VreplicaOut."

In particular, in the illustrated embodiment, the low-pass filter 208 may be configured as an RC filter that includes a resistive element 242 and a capacitive element 244. The resistive element 242 may be coupled between the amplifier output node 212 and the second overload node 216 as illustrated in FIG. 2A. The capacitive element 244 may be coupled between the second overload node 216 and ground as illustrated in FIG. 2A. The configuration of the resistive element 242 and the capacitive element 244 as illustrated and described may provide low pass filtering between the amplifier output node 212 and the second overload node 216 such that VreplicaOut may be a filtered version of Vout. In the illustrated embodiment, VreplicaOut may be a filtered version of Vout with DC values that may be equal to or substantially equal to those of Vout. In these or other embodiments, the low-pass filter 208 may be configured such that VreplicaOut may be based on the DC values of Vout but may not be the same. For example, the low-pass filter 208 may be configured such that VreplicaOut may be a multiple of the DC component of Vout in some embodiments.

The resistive element 242 and the capacitive element 244 may be selected based on their respective properties (e.g., resistance and capacitance) providing a target amount of low-pass filtering. For example, the resistive element 242 and the capacitive element 244 may be selected such that the low-pass filter 208 has a target frequency response such as a target cut-off frequency and/or target slope. In some embodiments, the amount of resistance of the resistive element 242 and the amount of capacitance of the capacitive element 244 may be based on particular fabrication constraints and properties and an amount of area that may be available for the low-pass filter 208.

The overload circuitry 206 may be analogous to the overload circuitry 106 of FIG. 1. In particular, the overload circuitry 206 may be configured to receive VreplicaIn at the first overload node 214 and may be configured to receive VreplicaOut at the second overload node 216. The overload circuitry 206 may be configured to detect when the current signal at the amplifier input node 210 exceeds a threshold level based on VreplicaIn and VreplicaOut. In response to and based on detecting that the current signal exceeds the threshold level, the overload circuitry 206 may be configured to direct at least a portion of the DC current of the current signal through a DC shunt path 248 that may be configured to shunt DC current. Additionally, in response to and based on detecting that the current signal exceeds the threshold level, the overload circuitry 206 may be configured to direct at least a portion of the AC current of the current signal through the AC shunt path 246 via the first overload node 214. As indicated above, FIG. 2B illustrates an example embodiment of the overload circuitry 206. As indicated above, in some embodiments, the DC shunting may be based on a DC component of the current signal exceeding a first threshold level and the AC shunting may be based on the shunted DC current exceeding a second threshold level.

Referring to FIG. 2B, the overload circuitry 206 may include an error amplifier 255 configured to detect whether the current signal at the amplifier input node 210 exceeds a threshold level based on VreplicaIn and VreplicaOut. In some embodiments, the error amplifier 255 may include a first input terminal 252 and a second input terminal 254. In the illustrated embodiment, the first input terminal 252 may be the non-inverting input terminal of the error amplifier 255 and the second input terminal 254 may be the inverting input terminal of the error amplifier 255. The first input terminal may be coupled to a voltage source 250 that may have a voltage level ("Vthreshold") and the voltage source 250 may be coupled to the first overload node 214, which may have a voltage of VreplicaIn as described earlier. Additionally, the second input terminal 254 may be coupled to the second overload node 216, which may have a voltage of VreplicaOut as described earlier. As the level of current signal at the amplifier input node 210 increases the voltage drop across the resistive element 232 illustrated in FIG. 2A may increase such that the voltage difference between Vin and Vout—and consequently between VreplicaIn and VreplicaOut—may increase. As such, when the current signal at the amplifier input node 210 exceeds a threshold level, the voltage difference between VreplicaIn and VreplicaOut may also exceed a threshold level. The voltage level Vthreshold of the voltage source 250 may be based on the current source 240 of FIG. 2A in which the shunting may occur such that the voltage and current at the output node 212 may be maintained at high enough levels to allow for the current source 240 to operate as needed.

An output terminal 256 of the error amplifier 255 may be coupled to a base of a DC shunting npn BJT 258 ("BJT 258") such that the error amplifier 255 may be configured to drive (e.g., activate or inactivate) the BJT 258. Additionally, the output terminal 256 may be coupled to a base of an npn BJT 272 ("BJT 272") of AC shunting activation circuitry 270 ("AC shunt activation circuitry 270") of the overload circuitry 206 such that the error amplifier 255 may be configured to drive (e.g., activate or inactive) the BJT 272.

The error amplifier 255 configured as illustrated in FIG. 2B and as described above may be configured to output a voltage signal that may activate the BJT 258 and the BJT 272 in response to the voltage drop from VreplicaIn to VreplicaOut being greater than Vthreshold. As described in further detail below, the BJT 258 may at least partially initiate the shunting of DC current when activated. Additionally, as described below in further detail below, the BJT 272 may operate as a driving transistor that may at least partially initiate the shunting of AC current when activated.

Because BJT 272 has the same base node 256 and emitter node (ground) as BJT 258, the Vbe for BJT 272 is equal to the Vbe for BJT 258. Therefore, the current Icollector through device BJT 272 may track the DC shunt current through BJT 258 with a ratio (Icollector/I DC shunt) dependent on the ratio of emitter area of BJT 272 to the emitter area of BJT 258. As such, the illustrated configuration of the error amplifier 255 may be such that the error amplifier 255 may at least partially initiate the shunting of DC and AC current based on VreplicaIn and VreplicaOut.

In the present disclosure, reference to a transistor being activated or being active may refer to the transistor being in a state in which electric current may pass through the transistor and may include when the transistor is operating in the triode region of operation or the saturation region of operation or in the forward active mode. Further, reference to a transistor being inactivated or inactive may refer to the transistor being in a state in which little to no electric current may pass through the transistor and may include when the transistor is operating in the cutoff region of operation. Further, reference of electric current passing through a transistor in the present disclosure may generally refer to current passing between a collector and an emitter in a BJT or current passing between a drain and source in a FET. In addition, reference of a transistor being coupled between nodes or components may refer to the drain and the source or the collector and emitter being coupled between the nodes or components.

DC Shunting

When the level of the current signal at the amplifier input node 210 is small (e.g., such that the DC component of Vout does not drop below VreplicaIn−Vthreshold), VreplicaOut may be substantially equal to VreplicaIn. The voltage source 250 may thus cause the voltage at node 252 to be less than the voltage at node 216. As such, the output node 256 of the error amplifier 255 may pull down to ground and force BJT 258 and BJT 272 to turn off. Under this condition, the DC shunt current and Icollector may be zero or approximately equal to zero.

As the level of the current signal at the amplifier input node 210 increases, the voltage drop across the resistive element 232 illustrated in FIG. 2A may increase such that the DC voltage difference between Vin and Vout—and consequently between VreplicaIn and VreplicaOut—may increase. As such, when the current signal at the amplifier input node 210 exceeds a threshold level, the voltage VreplicaOut may drop below VreplicaIn by more than a threshold level (e.g., Vthreshold). When this occurs, the voltage at node 216 may drop below the voltage at node 252. The voltage at node 256 at the output of amplifier 255 may also increase and thus turn on the BJT 258. This may cause the DC shunt current to be drawn from the input node 210 to ground. This may also cause the DC current through the resistive element 232 in FIG. 2A to be reduced and VreplicaOut may rise back to the voltage at node 252 that is VreplicaIn−Vthreshold.

In addition, the illustrated configuration of the overload circuitry 206 may also be such that as the DC component of the current signal at the amplifier input node 210 continues to increase beyond the threshold level, the DC shunt current may also increase proportionally with the increase in the DC component. Specifically, in the illustrated embodiment, the overload circuitry 206 may be configured such that the DC shunt current increases by the same amount or approximately the same amount as an increase in the DC component of the current signal at the input node 210. As such, even for very large DC currents at the input node 210 (e.g., due to large DC components of the current signal), the current through the resistive element 232 may be limited to Vthreshold divided by the resistance of the resistive element 232 ("R232") ("Vthreshold/R232").

In summary, when the DC component of the input current at node 110 is below a threshold, the voltage at node 252 (equal to VreplicaIn−Vthreshold) is less than the voltage at node 216 (equal to VreplicaOut). In this case the voltage at node 256 may be substantially ground and BJT 258 and BJT 272 may be off or essentially off. Thus, the DC shunt current may be zero or approximately equal to zero and Icollector may be zero or approximately equal to zero. When the input current at node 110 is above the threshold, the voltage VreplicaOut at node 216 may fall below the voltage at node 252. The error amplifier 255 may then control a servo loop. The action of the servo loop may cause the DC shunt current to be such that the DC component of the input current at node 110 minus the DC shunt current may flow through resistive element 232 causing VreplicaOut to be substantially equal to (VreplicaIn−Vthreshold). In some embodiments, Vthreshold may operate as the first threshold described above.

AC Shunting

The AC shunt path 246 may include the BJT 228 and the first overload node 214 as indicated in FIG. 2A. In addition, the AC shunt path 246 may include an n-type MOSFET 260 illustrated in FIG. 2B. The MOSFET 260 may have a drain coupled to the amplifier input node 210 and a source coupled to the first overload node 214. The MOSFET 260 may have a gate coupled to the AC shunt activation circuitry 270 such that the AC shunt activation circuitry 270 may be configured to drive the MOSFET 260. A further description of the AC shunt activation circuitry 270 and its activation of the MOSFET 260 is given below.

When the MOSFET 260 is active, the MOSFET 260 may provide an electrical connection between the amplifier input node 210 and the first overload node 214. The electrical connection between the amplifier input node 210 and the first overload node 214 via the MOSFET 260 may allow AC current to pass from the amplifier input node 210 to the first overload node 214. As such, at least a portion of the AC shunt path 246 may be between the amplifier input node 210 and the first overload node 214 and may include the MOSFET 260. In contrast, when the MOSFET 260 is not active, little to no electrical connectivity may be made by the MOSFET 260 between the amplifier input node 210 and the first overload node 214 such that AC current may not be shunted through the AC shunt path 246.

The AC shunt activation circuitry 270 may include the BJT 272; a current source 273; p-type MOSFETs 276, 278, and 280 ("p-mos 276," "p-mos 278," and "p-mos 280"); n-type MOSFETS 282, and 284 ("n-mos 282" and "n-mos 284"); resistive elements 293, 294, 295, and 296; and differential amplifiers 285 and 287; all configured and arranged as illustrated in FIG. 2B. In the illustrated embodiment, the current source 273 may include any suitable system, apparatus, or device that may be configured to generate a current. The p-mos transistors 276, 278, and 280 may be configured as current mirrors with respect to each other as illustrated. In some embodiments, the p-mos transistors 276, 278, and 280 may be sized the same such that the same amount of current may pass through them. In these or other embodiments, one or more of the p-mos transistors 276, 278, and 280 may be sized differently such that the current that may pass through the differently sized p-mos transistors may be multiples of each other.

Further, a drain of the p-mos 278 may be coupled to a node 281 and the resistive element 294 may be coupled to the node 281 and to the gate and drain of the n-mos 282 as illustrated. Further, the resistive element 293 may be coupled between the node 281 and a node 283. The node 283 may be coupled to the gate of the MOSFET 260. The resistive element 293 configured as illustrated may operate as an AC blocking resistor. Further, the resistive element 294 and the n-mos 282 configured as illustrated may create a gate drive load impedance with respect to the gate of the MOSFET 260. The n-mos 282 configured as illustrated may operate as a diode with its source coupled to the first overload node 214.

In addition, a drain of the p-mos 280 may be coupled to a node 289 and the resistive element 296 may be coupled to the node 289 and to the gate and drain of the n-mos 284 as illustrated. Further, the resistive element 295 may be coupled between the node 289 and a node 261. The resistive element 295 configured as illustrated may operate as an AC blocking resistor. Further, the resistive element 296 and the n-mos 284 configured as illustrated may create a body drive load impedance with respect to the node 261. The n-mos 284 configured as illustrated may operate as a diode with its source coupled to ground. In some embodiments, the resistive elements 293 and 295 may have the same or approximately the same resistance; the resistive elements 294 and 296 may have the same or approximately the same resistance; and the n-mos 282 and the n-mos 284 may have the same or approximately the same size such that a voltage difference between the body and the gate of the MOSFET 260 may be constant or close to constant, which may reduce electrical overstress of the MOSFET 260.

Further, in some embodiments, the MOSFET 260 may have a relatively small size and may be sensitive to (e.g., damaged by) voltage differences between the gate and the source above a certain level. As such, in some embodiments, the AC shunt activation circuitry 270 may include the differential amplifiers 285 and 287. The differential amplifier 285 may be coupled to the node 281 and the differential amplifier 287 may be coupled to the node 289 as illustrated in FIG. 2B and may be configured to limit the voltage drops across the resistive elements 294 and 296, respectively to help protect the MOSFET 260 from electrical overstress.

In particular, the differential amplifier 285 may include an npn BJT 286 ("BJT 286"), an npn BJT 288 ("BJT 288"), a current source 274, and a voltage source 297 with a voltage of "Vlimit," which may be based on a max voltage level swing that the MOSFET 260 may sustain. Similarly, the differential amplifier 287 may include an npn BJT 290 ("BJT 290") the same size or approximately the same size as the BJT 286, an npn BJT 292 ("BJT 292") the same size or approximately the same size as the BJT 288, a current source 275 configured the same or approximately the same size as the current source 274, and a voltage source 298 with the voltage of "Vlimit." The configuration of the differential amplifiers 285 and 287 as illustrated may limit the voltage drops across the resistive elements 294 and 296 by "Vlimit."

As the voltage across resistive element 294 plus the voltage across n-mos 282 begins to approach Vlimit, BJT 286 will begin to conduct current and a portion of the current flowing from p-mos 278 into resistive element 294 may be directed through the BJT 286. This reduction in current through resistive element 294 may reduce and limit the gate drive voltage at node 281. In a similar manner, as the voltage across the resistive element 296 plus the voltage across n-mos 284 begins to approach Vlimit, the BJT 290 may begin to conduct current and a portion of the current flowing from p-mos 280 into resistive element 296 may be directed through BJT 290. This reduction in current through resistive element 296 may reduce and limit the body drive voltage at node 289.

The current source 273 may be configured to generate a threshold current "Ithreshold" and the operations of the AC shunt activation circuitry 270 may be based on the relationship between Ithreshold and the current that may pass through the BJT 272 "Icollector" such that the BJT 272 may operate as a driving BJT with respect to the AC shunt activation circuitry. Further, as indicated above, the BJT 272 may be activated by the error amplifier 255 to allow current to pass through it. As such, the operations of the AC shunt activation circuitry 270 may also at least partially be controlled by the error amplifier 255 because the amount of Icollector may be controlled by the error amplifier 255. The current through BJT 272 (Icollector) may be a fixed ratio of the DC shunt current through BJT 258 in some embodiments.

In some embodiments, Ithreshold may be based on a current ratio between AC current and DC current in the input signal and a target point of initiating AC shunting with respect to the DC current level of the input signal as compared to the AC current level of the input signal. In these or other embodiments, the BJT 272 may be sized based on Ithreshold such that the BJT 272 may be able to allow current greater than Ithreshold to pass through it. As indicated, above, a value of Ithreshold may be relatively small to reduce power consumption such that the BJT 272 may be sized relatively small also. For example, the BJT 272 may be sized ten times smaller than the BJT 258 based on the different current loads that the BJT 272 may handle as compared to those that may be handled by the BJT 258 with respect to DC current shunting. The sizing differences between the BJT 272 and the BJT 258 may be based on target power savings in which the smaller the size of the BJT 272 the more power savings and may also be based on the size of the BJT 272 allowing for target operation of the AC shunt activation circuitry 270.

As indicated above, the operations of the AC shunt activation circuitry 270 may be based on the relationship of Icollector with respect to Ithreshold. In particular, the operations of the AC shunt activation circuitry 270 may be based on whether: (1) Icollector is less than or equal to Ithreshold; (2) Icollector is slightly greater than Ithreshold; and (3) Icollector is greater than Ithreshold by more than a slight amount. Additionally, as indicated above, Icollector may correspond to the DC shunt current such that activation of the AC shunting may be based on a relationship between the DC shunt current with Ithreshold. As such, in some embodiments, Ithreshold may operate as the second threshold referenced above.

Icollector is Less than or Equal to Ithreshold

When Icollector is less than or equal to Ithreshold (e.g., when the BJT 272 is inactive), the AC shunt activation circuitry 270 may operate as follows. When Icollector is less than or equal to Ithreshold, little to no current may pass through the p-mos 276. Additionally, the p-mos 278 and the p-mos 280 may be configured as current mirrors with respect to each other and with respect to the p-mos 276. As such, when little to no current passes through the p-mos 276, little to no current may pass through the p-mos 278 and the p-mos 280 also. With little to no current passing through the p-mos 278, the voltage drop across the resistive element 294 may be at or approximately equal to zero and the amount of current that may pass through the n-mos 282 (which may be configured as a diode as illustrated) may also be at or approximately equal to zero. Similarly, with little to no current passing through the p-mos 280, the voltage drop across the resistive element 296 may be at or approximately equal to zero and the amount of current that may pass through the n-mos 284 (which may be configured as a diode as illustrated) may also be at or approximately equal to zero.

As illustrated in FIG. 2B, with little to no voltage drop across the resistive element 294 and the n-mos 282, a voltage at the nodes 281, 283, 210, and 214 may be the same or approximately the same such that the voltage across the gate and source "Vgs" and the voltage across the gate and the drain "Vds" of the MOSFET 260 may be at or approximately equal to zero. As such, the MOSFET 260 may not be active in this state such that AC current may not be shunted. Additionally, with little to no voltage drop across the resistive element 296 and the n-mos 284, a voltage at the node 289 and the node 261 may be the same or approximately the same (e.g., at ground) such that the voltage across the drain and body "Vdb" and the voltage across the source and the body "Vsb" of the MOSFET 260 may equal to each other or approximately equal to each other such that the body may be reverse biased with respect to the drain and the source at a value at approximately Vin or VreplicaIn. The reverse biasing may result in a lower junction capacitance at the amplifier input node 210.

Icollector is Slightly Greater than Ithreshold

When Icollector is slightly greater than Ithreshold, the AC shunt activation circuitry 270 may operate as follows. In the present disclosure, reference of Icollector being slightly greater than Ithreshold as opposed to reference of Icollector being greater than Ithreshold may indicate that the AC shunt activation circuitry 270 is operating in an on-state, but not enough to cause the differential amplifiers 285 and 287 to begin limiting voltage drops as described above. When Icollector is slightly greater than Ithreshold, the current difference may flow through the p-mos 276 and accordingly may be mirrored by the p-mos 278 and the p-mos 280. The voltage drop across the resistive element 294 and the n-mos 282 may rise to the threshold voltage ("Vt") of the diode that may be formed by the n-mos 282. Further, in some embodiments, the n-mos transistors 282 and 284 may be configured with respect to the MOSFET 260 such that the MOSFET 260 may also have the threshold voltage Vt. A voltage drop across the resistive element 294 and the n-mos 282 of Vt may cause Vgs-Vt of the MOSFET 260 to be such that the MOSFET 260 may begin to activate to allow the shunting of AC current through the MOSFET 260. Further, the voltage drop across the resistive element 296 and the n-mos 284 may also rise to the threshold voltage Vt of the diode that may be formed by the n-mos 284. Because the voltage drop across the resistive element 294 and the n-mos 282 may be equal to or approximately equal to the voltage drop across the resistive element 296 and the n-mos 284, the voltage difference between the gate and the body of the MOSFET 260 may be approximately the same based on the illustrated configuration to help avoid electrical overstress of the MOSFET 260.

Icollector is Greater than Ithreshold

When Icollector is greater than Ithreshold, the AC shunt activation circuitry 270 may operate as follows. In the present disclosure, reference of Icollector being greater than Ithreshold as opposed to reference of Icollector being slightly greater than Ithreshold may indicate that the AC shunt activation circuitry 270 is operating in an on-state, at or slightly below the level to cause the differential amplifiers 285 and 287 to begin limiting voltage drops as described above. In other words, the AC shunt activation circuitry 270 may be operating in a fully on state when Icollector is greater than Ithreshold and may be operating between an off state and a fully on state when Icollector is slightly greater than Ithreshold.

As with when Icollector is slightly greater than Ithreshold, when Icollector is greater than Ithreshold the current difference may flow through the p-mos 276 and accordingly may be mirrored by the p-mos 278 and the p-mos 280. The voltage drop across the resistive element 294 may be approximately equal to the overdrive voltage ("Von" or "Vgs-Vt") of the MOSFET 260 and may thus cause the MOSFET 260 to activate. Further, the DC voltage between the drain and the source of the MOSFET 260 may be relatively small such that a channel resistance of the MOSFET 260 may be inversely dependent on Von and therefore may be inversely dependent on the voltage drop across the resistive element 294. In this mode of operation, a relatively low Vds may result in a substantially linear channel resistance of the MOSFET 260 with the channel resistance lowering as more current flows through BJT 272, which may also correspond to the channel resistance lowering as the DC shunt current rises. Further, as described above, the voltage difference between the gate and the body of the MOSFET 260 may remain at or near constant to help avoid electrical overstress of the MOSFET 260.

Modifications, additions, or omissions may be made to the system 200 without departing from the scope of the present disclosure. For example, properties (e.g., sizes, resistance, voltages, currents, geometry, type, etc.) of the components listed may vary depending on different implementations. Further, depending on different implementations, other components than those described may be included in the system 200 or one or more components may be removed. Further, the system 200 is described as including certain types of transistors. However, in these or other embodiments, one or more of the transistors described may be replaced with a different type of transistor. In addition, certain components have been described as being included in certain types of circuitry for the ease of explanation, but the labels of the circuitry are not meant to be limiting or to imply that components included therein are limited to functionality described with respect to such circuitry.

Figure 3:
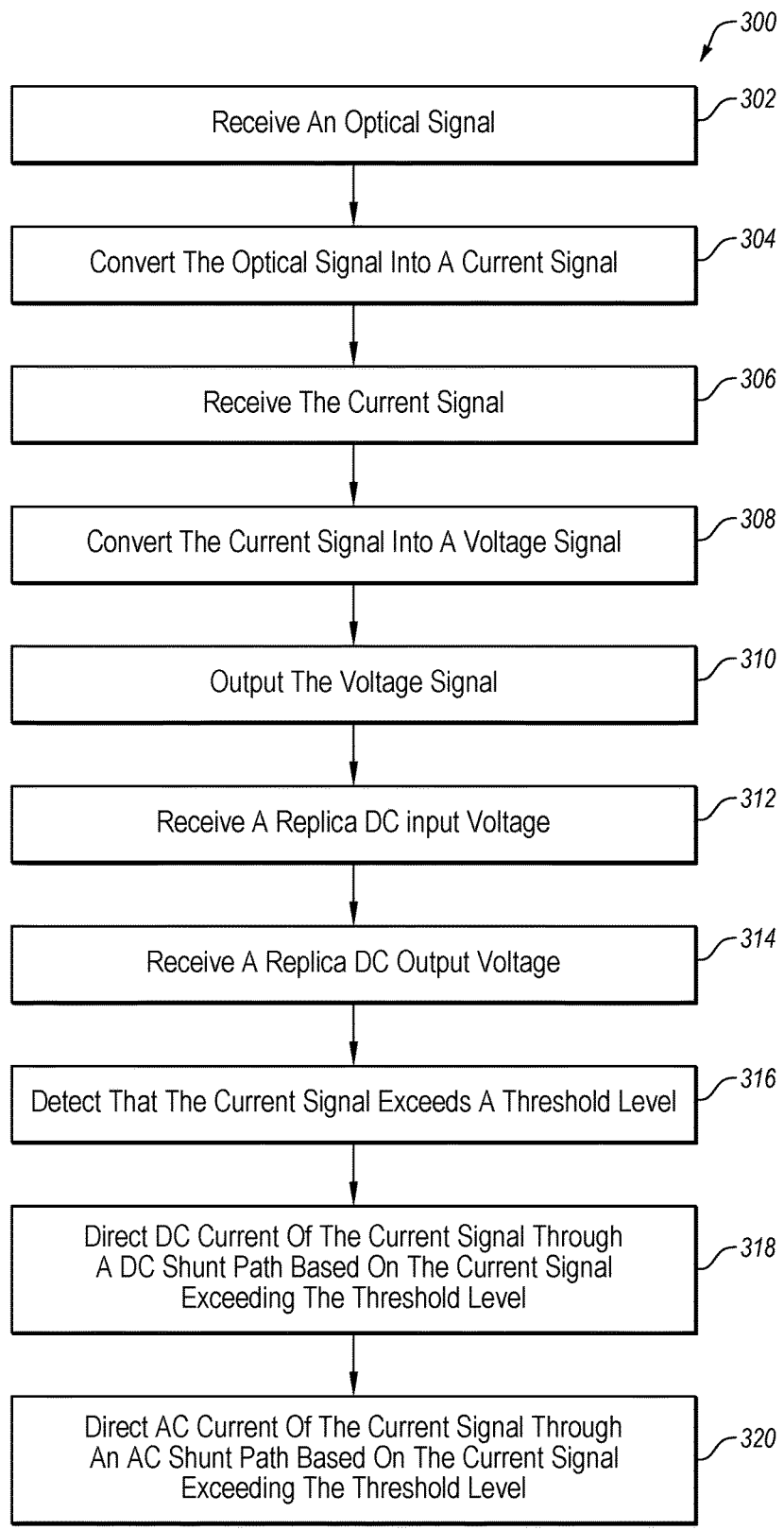
FIG. 3 is a flowchart of an example method of shunting DC and AC current.

FIG. 3 is a flowchart of an example method 300 of shunting DC and AC current, according to some embodiments described in the present disclosure. The method 300 may be implemented, in some embodiments, by a system such as the systems 100 and 200 described above with respect to FIGS. 1 and 2A-2B. Although the method 300 is illustrated as certain operations being performed with respect to discrete blocks, various blocks may be divided into additional blocks, combined into fewer blocks, or eliminated, depending on the implementation.

The method 300 may begin at block 302 at which an optical signal may be received. At block 304, the optical signal may be converted into a current signal. At block 306, the optical signal may be received at an amplifier input node and at block 308, the current signal received at the amplifier input node may be converted to a voltage signal. At block 310, the voltage signal may be output at an amplifier output node.

At block 312, a replica DC input voltage may be received. The replica DC input voltage may correspond to a DC input voltage at the amplifier input node. At block 314, a replica DC output voltage may be received. The replica DC output voltage may correspond to a DC output voltage at the amplifier output node.

At block 316, it may be detected whether the current signal exceeds a threshold level, such as described above. For example, in some embodiments it may be determined whether a DC component of the current signal exceeds a first threshold level such as described above. At block 318, DC current of the current signal may be directed through a DC shunt path in response to and based on the current signal exceeding the threshold level.

At block 320, AC current of the current signal may be directed through an AC shunt path in response to and based on the current signal exceeding the threshold level. As indicated above, in some embodiments, the threshold at block 316 may be a first threshold and the AC current may be shunted in response to detecting that the shunted DC current exceeds a second threshold level. As explained above, the shunted DC current may be based on the first threshold level such that the shunting of the AC current may also be at least indirectly based on the first threshold level. The AC shunt path and the DC shunt path may be separate paths in some embodiments.

Accordingly, the method 300 may be used to perform DC and AC shunting according to the present disclosure. Modifications, additions, or omissions may be made to the method 300 without departing from the scope of the present disclosure. For example, the operations of method 300 may be implemented in differing order. Additionally or alternatively, two or more operations may be performed at the same time. Furthermore, the outlined operations and actions are only provided as examples, and some of the operations and actions may be optional, combined into fewer operations and actions, or expanded into additional operations and actions without detracting from the essence of the disclosed embodiments. For example, in some embodiments, the method 300 may be applied to current signals that are not based on optical signals such that operations associated with blocks 302 and 304 may be omitted.

Further, in some embodiments, the method 300 may include any number of operations described above as being performed with respect to the systems 100 and 200. For example the method 300 may include operations related to generating the replica DC input voltage based on a replica current and setting the DC input voltage based on the replica current such that the DC input voltage at the amplifier input node substantially matches the replica DC input voltage. As another example, the method 300 may include operations related to activating a DC shunting transistor, an AC shunting transistor, or AC shunting activation circuitry in response to detecting that the current signal exceeds the threshold level. Moreover, in some embodiments, the method 300 may include operations related to filtering, with a low-pass filter, the voltage signal to generate the replica DC output voltage.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one," "one or more," "at least one of the following," and "one or more of the following" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited in the present disclosure are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure.

What is claimed is:

1. An optical receiver comprising:
   a photodetector configured to:
     receive an optical signal;
     convert the optical signal into a current signal; and
     output the current signal at an amplifier input node;
   amplifier circuitry coupled to the amplifier input node and configured to:
     receive the current signal at the amplifier input node;
     convert the current signal received at the amplifier input node to a voltage signal; and
     output the voltage signal at an amplifier output node; and
   overload circuitry coupled to the amplifier input node and configured to:
     receive a replica DC input voltage at a first overload node, wherein the replica DC input voltage corresponds to a DC input voltage at the amplifier input node;
     receive a replica DC output voltage at a second overload node, wherein the replica DC output voltage corresponds to a DC output voltage at the amplifier output node;
     detect that a DC component of the current signal exceeds a first threshold level based on the replica DC input voltage and the replica DC output voltage;
     direct DC current of the current signal through a DC shunt path in response to and based on detecting that the DC component of the current signal exceeds the first threshold level; and
     direct AC current of the current signal through an AC shunt path in response to and based on detecting that shunted DC current passing through the DC shunt path exceeds a second threshold level, wherein the AC shunt path is different from the DC shunt path.

2. The optical receiver of claim 1, wherein the amplifier circuitry includes:
   replica bias circuitry coupled to the first overload node and configured to generate the replica DC input voltage based on a replica current; and
   core amplifier circuitry coupled to the replica bias circuitry and the amplifier input node and configured to set the DC input voltage based on the replica current such that the DC input voltage at the amplifier input node substantially matches the replica DC input voltage.

3. The optical receiver of claim 1, wherein the DC shunt path includes a DC shunting transistor that is coupled between the amplifier input node and ground such that the shunted DC current is shunted from the amplifier input node to ground via the DC shunting transistor.

4. The optical receiver of claim 3, wherein the overload circuitry further comprises an error amplifier configured to detect that the DC component of the current signal exceeds the first threshold level based on the replica DC input voltage and the replica DC output voltage, wherein the error amplifier includes an error amplifier output coupled to a control terminal of the DC shunting transistor such that the error amplifier activates the DC shunting transistor in response to detecting that the DC component of the current signal exceeds the first threshold level.

5. The optical receiver of claim 4, wherein the overload circuitry further comprises AC shunting activation circuitry configured to activate the AC shunt path to shunt the AC current, wherein the AC shunting activation circuitry includes a driving transistor configured to drive the AC shunting activation circuitry and wherein the error amplifier output is coupled to a control terminal of the driving transistor such that the error amplifier controls activation of the AC shunt path by controlling a voltage at the control terminal of the driving transistor.

6. The optical receiver of claim 1, further comprising a low-pass filter coupled between the amplifier output node and the second overload node and configured to filter the voltage signal to generate the replica DC output voltage at the second overload node.

7. The optical receiver of claim 1, wherein the AC shunt path includes the amplifier input node and the first overload node such that the AC current is shunted from the amplifier input node to the first overload node.

8. The optical receiver of claim 7, wherein the AC shunt path includes an AC shunting transistor that is coupled between the amplifier input node and the first overload node such that the shunted AC current passes from through the AC shunting transistor to the first overload node.

9. The optical receiver of claim 8, wherein:
the overload circuitry further comprises AC shunting activation circuitry configured to activate the AC shunting transistor;
the AC shunting activation circuitry includes a driving transistor configured to drive the AC shunting activation circuitry;
the overload circuitry further comprises an error amplifier configured to detect that the current signal exceeds the threshold level based on the replica DC input voltage and the replica DC output voltage; and
an error amplifier output of the error amplifier is coupled to a control terminal of the driving transistor such that the error amplifier controls activation of the AC shunting transistor by controlling a voltage at the control terminal of the driving transistor.

10. The optical receiver of claim 7, wherein the AC shunting transistor is a first AC shunting transistor and the AC shunt path includes a second AC shunting transistor coupled between the first overload node and ground such that the shunted AC current passes to ground via the second AC shunting transistor.

11. The optical receiver of claim 1, wherein the overload circuitry is configured such that the DC current directed through the DC shunt path increases proportionally with increases in the DC component of the current signal.

12. A method comprising:
receiving a current signal at an amplifier input node;
converting the current signal received at the amplifier input node to a voltage signal;
outputting the voltage signal at an amplifier output node;
receiving a replica DC input voltage that corresponds to a DC input voltage at the amplifier input node;
receiving a replica DC output voltage that corresponds to a DC output voltage at the amplifier output node;
detecting that a DC component of the current signal exceeds a first threshold level based on the replica DC input voltage and the replica DC output voltage;
directing DC current of the current signal through a DC shunt path in response to and based on detecting that the DC component of the current signal exceeds the first threshold level; and
directing AC current of the current signal through an AC shunt path in response to and based on detecting that shunted DC current passing through the DC shunt path exceeds a second threshold level, wherein the AC shunt path is different from the DC shunt path.

13. The method of claim 12, further comprising
generating the replica DC input voltage based on a replica current; and
setting the DC input voltage based on the replica current such that the DC input voltage at the amplifier input node substantially matches the replica DC input voltage.

14. The method of claim 12, further comprising activating a DC shunting transistor in response to detecting that the current signal exceeds the threshold level.

15. The method of claim 12, further comprising activating an AC shunting transistor in response to detecting that the shunted DC current exceeds the second threshold level.

16. The method of claim 12, further comprising activating, in response to detecting that the shunted DC current exceeds the second threshold level, AC shunting activation circuitry configured to activate the AC shunt path to shunt the AC current.

17. The method of claim 12, further comprising filtering, with a low-pass filter, the voltage signal to generate the replica DC output voltage.

18. A circuit comprising:
amplifier circuitry configured to:
receive a current signal at an amplifier input node;
convert the current signal received at the amplifier input node to a voltage signal; and
output the voltage signal at an amplifier output node; and
overload circuitry coupled to the amplifier input node and configured to:
receive a replica DC input voltage at a first overload node, wherein the replica DC input voltage corresponds to a DC input voltage at the amplifier input node;
receive a replica DC output voltage at a second overload node, wherein the replica DC output voltage corresponds to a DC output voltage at the amplifier output node;
detect that a DC component of the current signal exceeds a first threshold level based on the replica DC input voltage and the replica DC output voltage;
direct DC current of the current signal through a DC shunt path in response to and based on detecting that the DC component of the current signal exceeds the first threshold level; and
direct AC current of the current signal through an AC shunt path in response to and based on detecting that shunted DC current passing through the DC shunt path exceeds a second threshold level, wherein the AC shunt path is different from the DC shunt path.

19. The circuit of claim 18, wherein the DC shunt path includes a DC shunting transistor that is coupled between the amplifier input node and ground such that the shunted DC current is shunted from the amplifier input node to ground via the DC shunting transistor.

20. The circuit of claim 19, wherein the overload circuitry further comprises an error amplifier configured to detect that the current signal exceeds the threshold level based on the replica DC input voltage and the replica DC output voltage, wherein the error amplifier includes an error amplifier output coupled to a control terminal of the DC shunting transistor such that the error amplifier activates the DC shunting transistor in response to detecting that the current signal exceeds the threshold level.

21. The circuit of claim 20, wherein the overload circuitry further comprises AC shunting activation circuitry configured to activate the AC shunt path to shunt the AC current, wherein the AC shunting activation circuitry includes a driving transistor configured to drive the AC shunting activation circuitry and wherein the error amplifier output is coupled to a control terminal of the driving transistor such that the error amplifier controls activation of the AC shunt path by controlling a voltage at the control terminal of the driving transistor.

* * * * *